(12) United States Patent
Chiron et al.

(10) Patent No.: US 10,491,162 B2
(45) Date of Patent: Nov. 26, 2019

(54) ENVELOPE TRACKING AMPLIFIER CIRCUIT

(71) Applicant: Qorvo US, Inc., Greensboro, NC (US)

(72) Inventors: Jean-Frederic Chiron, Tournefeuille (FR); Nadim Khlat, Cugnaux (FR); Andrew F. Folkmann, Cedar Rapids, IA (US); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/939,494

(22) Filed: Mar. 29, 2018

(65) Prior Publication Data

US 2019/0181803 A1    Jun. 13, 2019

Related U.S. Application Data

(60) Provisional application No. 62/596,225, filed on Dec. 8, 2017.

(51) Int. Cl.
*H03F 3/04* (2006.01)
*H03F 1/02* (2006.01)
(Continued)

(52) U.S. Cl.
CPC .......... *H03F 1/0233* (2013.01); *H03F 3/193* (2013.01); *H03F 3/21* (2013.01); *H03F 1/0244* (2013.01);
(Continued)

(58) Field of Classification Search
CPC .......... H03F 1/0233; H03F 3/21; H03F 3/193; H03F 2200/102; H03F 1/0244;
(Continued)

(56) References Cited

U.S. PATENT DOCUMENTS 9,172,330 B2 * 10/2015 Midya .................... H03F 1/0222
9,231,627 B2 * 1/2016 Arno ..................... H04B 1/0475
(Continued)

OTHER PUBLICATIONS

Pfister, Henry, "Discrete-Time Signal Processing," Lecture Note, pfister.ee.duke.edu/courses/ece485/dtsp.pdf, Mar. 3, 2017, 22 pages.
(Continued)

*Primary Examiner* — Khanh V Nguyen
(74) *Attorney, Agent, or Firm* — Withrow & Terranova, P.L.L.C.

(57) ABSTRACT

An envelope tracking (ET) amplifier circuit is provided. In examples discussed herein, an amplifier circuit(s) is configured to amplify a radio frequency (RF) signal based on an ET modulated voltage. A tracker circuit is configured to generate the ET modulated voltage based on a number of target voltage amplitudes derived from a time-variant signal envelope of the RF signal. However, the tracker circuit can cause the ET modulated voltage to deviate from the target voltage amplitudes due to various impedance variations. In this regard, a voltage memory digital pre-distortion (mDPD) circuit digitally pre-distorts the target voltage amplitudes based on the time-variant signal envelope such that the ET modulated voltage can closely track the target voltage amplitudes. As such, it is possible to mitigate ET modulated voltage deviation, thus helping to improve overall linearity performance of the ET amplifier circuit.

20 Claims, 5 Drawing Sheets

(51) Int. Cl.
　　　*H03F 3/193*　　　(2006.01)
　　　*H03F 3/21*　　　(2006.01)
　　　*H03F 1/32*　　　(2006.01)

(52) U.S. Cl.
　　　CPC ...... *H03F 1/3247* (2013.01); *H03F 2200/102* (2013.01)

(58) Field of Classification Search
　　　CPC ............ H03F 1/0211; H03F 2200/504; H03F 1/0227; H03G 3/3042; H03G 3/004; H03G 3/3047; H03G 3/3036
　　　USPC ........................................ 330/127, 129, 297
　　　See application file for complete search history.

(56) References Cited

U.S. PATENT DOCUMENTS

| | | | |
|---|---|---|---|
| 9,794,006 B2* | 10/2017 | Carlsson | ............... H03F 1/0222 |
| 2014/0028370 A1 | 1/2014 | Wimpenny | |
| 2017/0141736 A1 | 5/2017 | Pratt et al. | |
| 2019/0109566 A1 | 4/2019 | Folkmann et al. | |

OTHER PUBLICATIONS

Non-Final Office Action for U.S. Appl. No. 15/888,260, dated May 2, 2019, 14 pages.

* cited by examiner

ENVELOPE TRACKING AMPLIFIER CIRCUIT

RELATED APPLICATIONS

This application claims the benefit of U.S. Provisional Patent Application Ser. No. 62/596,225, filed on Dec. 8, 2017, which is incorporated herein by reference in its entirety.

FIELD OF THE DISCLOSURE

The technology of the disclosure relates generally to envelope tracking (ET) power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the PAs are operating at a higher efficiency for a given instantaneous output power requirement of the RF signals.

SUMMARY

Aspects disclosed in the detailed description include an envelope tracking (ET) amplifier circuit. In examples discussed herein, an amplifier circuit(s) is configured to amplify a radio frequency (RF) signal based on an ET modulated voltage. A tracker circuit is configured to generate the ET modulated voltage based on a number of target voltage amplitudes derived from a time-variant signal envelope of the RF signal. However, the tracker circuit can cause the ET modulated voltage to deviate from the target voltage amplitudes due to various inherent impedance variations, particularly at a higher modulation bandwidth (e.g., 60 MHz). In this regard, a voltage memory digital pre-distortion (mDPD) circuit is configured to digitally pre-distort the target voltage amplitudes based on the time-variant signal envelope such that the ET modulated voltage can closely track the target voltage amplitudes. As such, it is possible to mitigate ET modulated voltage deviation, thus helping to improve overall linearity performance of the ET amplifier circuit.

In one aspect, an ET amplifier circuit is provided. The ET amplifier circuit includes a voltage processing circuit comprising an input node and an output node. The voltage processing circuit is configured to receive a number of signal amplitudes representing a time-variant signal envelope at the input node. The voltage processing circuit is also configured to generate a number of target voltage amplitudes based on the number of signal amplitudes, respectively, at the output node. The ET amplifier circuit also includes a voltage mDPD circuit coupled to the input node and the output node. The voltage mDPD circuit is configured to receive the number of signal amplitudes and the number of target voltage amplitudes. The voltage mDPD circuit is also configured to digitally pre-distort the number of target voltage amplitudes based on the number of signal amplitudes to generate a digital target voltage signal including a number of altered target voltage amplitudes configured to cause at least one ET modulated voltage to closely track the plurality of target voltage amplitudes.

In another aspect, a method for reducing ET modulated voltage deviation is provided. The method includes receiving a number of signal amplitudes representing a time-variant signal envelope. The method also includes receiving a number of target voltage amplitudes generated based on the number of signal amplitudes, respectively. The method also includes digitally pre-distorting the number of target voltage amplitudes based on the number of signal amplitudes to generate a digital target voltage signal including a number of altered target voltage amplitudes configured to cause at least one ET modulated voltage to closely track the plurality of target voltage amplitudes.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
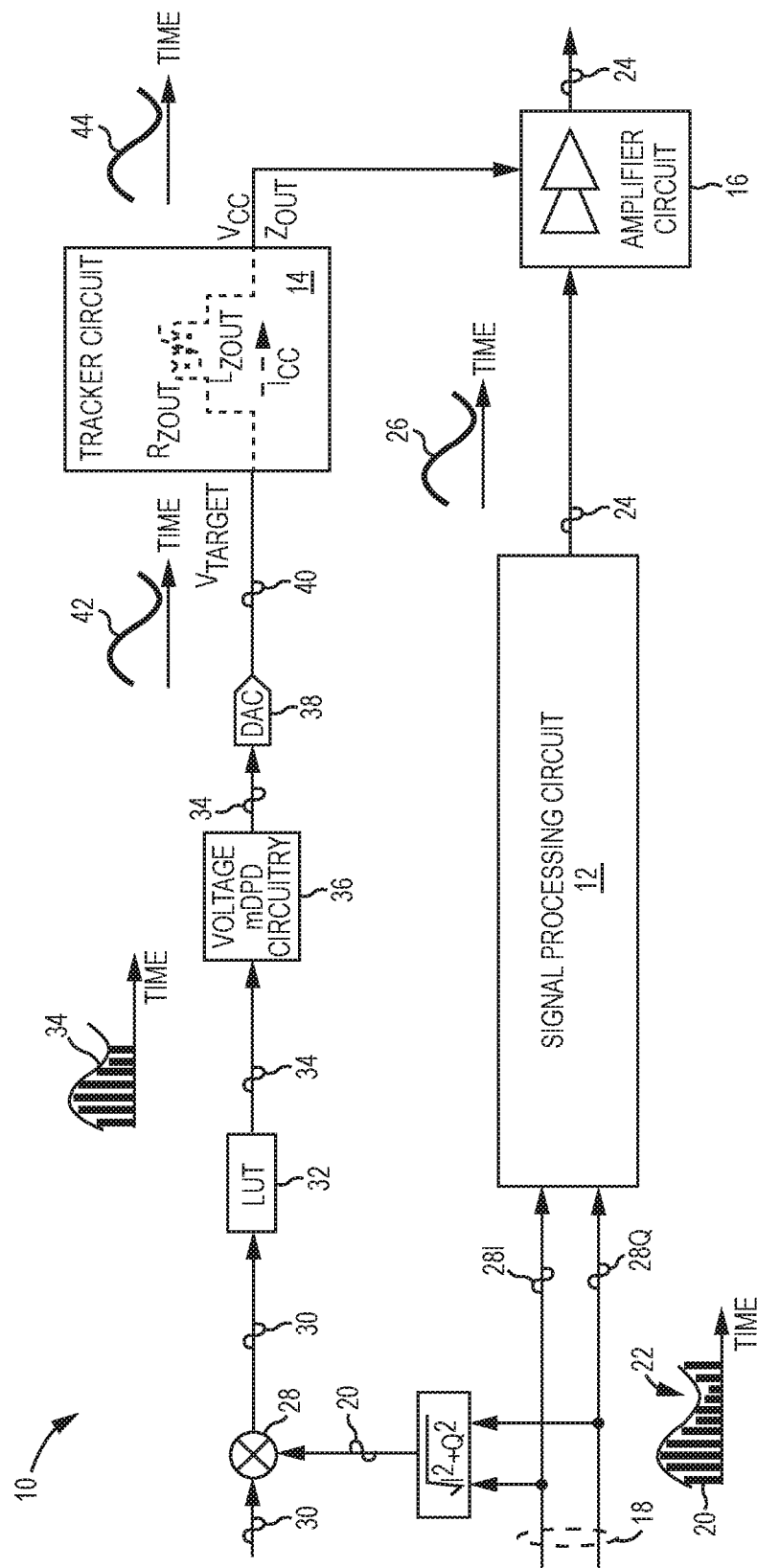
FIG. 1 is a schematic diagram of an exemplary existing ET amplifier circuit that can experience degraded overall linearity performance as a result of ET modulated voltage deviation.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) amplifier circuit. In examples discussed herein, an amplifier circuit(s) is configured to amplify a radio frequency (RF) signal based on an ET modulated voltage. A tracker circuit is configured to generate the ET modulated voltage based on a number of target voltage amplitudes derived from a time-variant signal envelope of the RF signal. However, the tracker circuit can cause the ET modulated voltage to deviate from the target voltage amplitudes due to various impedance variations, particularly at a higher modulation bandwidth (e.g., 60 MHz). In this regard, a voltage memory digital pre-distortion (mDPD) circuit is configured to digitally pre-distort the target voltage amplitudes based on the time-variant signal envelope such that the ET modulated voltage can closely track the target voltage amplitudes. As such, it is possible to mitigate ET modulated voltage deviation, thus helping to improve overall linearity performance of the ET amplifier circuit.

Before discussing the ET amplifier circuit of the present disclosure, a brief overview of an existing ET amplifier circuit that may experience degraded overall linearity performance as a result of ET modulated voltage deviation is first provided with references to FIG. 1. The discussion of specific exemplary aspects of using a voltage mDPD circuit to correct the ET modulated voltage deviation in an ET amplifier circuit starts below with reference to FIG. 2.

FIG. 1 is a schematic diagram of an exemplary existing ET amplifier circuit 10 that can experience degraded overall linearity performance as a result of ET modulated voltage deviation. The existing ET amplifier circuit 10 includes a signal processing circuit 12, a tracker circuit 14, and an amplifier circuit 16. The signal processing circuit 12 receives a digital signal 18 that includes a number of signal amplitudes 20 representing a time-variant signal envelope 22. The signal processing circuit 12 is configured to convert the digital signal 18 into an RF signal 24 having a time-variant power envelope 26 tracking the time-variant signal envelope 22. In this regard, the time-variant signal envelope 22, which is defined by the signal amplitudes 20, is a digital representation of the time-variant power envelope 26.

The digital signal 18 may be modulated to include a digital in-phase signal 28I, which has a number of in-phase amplitudes I, and a digital quadrature signal 28Q, which has a number of quadrature amplitudes Q. In this regard, the signal amplitudes 20 of the digital signal 18 can be expressed as $\sqrt{I^2+Q^2}$.

The existing ET amplifier circuit 10 includes a mixer 28 that combines the signal amplitudes 20 with a digital target voltage signal 30 such that the digital target voltage signal 30 can track the time-variant signal envelope 22. The existing ET amplifier circuit 10 includes lookup table (LUT) circuitry 32, which stores predetermined target voltage amplitude values corresponding to each of the signal amplitudes 20. In this regard, the LUT circuitry 32 converts the signal amplitudes 20 into a number of target voltage amplitudes 34 in the digital target voltage signal 30 based on the predetermined target voltage amplitude values. As a result of such digital conversion, the target voltage amplitudes 34 may be distorted. For example, the LUT circuitry 32 can be non-strictly monotonic. As a result, a target voltage amplitude among the target voltage amplitudes 34 can become higher or lower than a corresponding signal amplitude among the signal amplitudes 20 as a result of the digital conversion.

The existing ET amplifier circuit 10 includes a voltage mDPD circuit 36 configured to digitally pre-distort the target voltage amplitudes 34 in the digital target voltage signal 30 to overcome memory effect of a nonlinear circuit, such as the tracker circuit 14 and/or associated load of the amplifier circuit 16. In a non-limiting example, the memory effect refers to a nonlinear circuit whose present output depends not only on the present input, but also on past inputs of the nonlinear circuit. In this regard, the voltage mDPD circuit 36 is intended to pre-compensate for distortions of the target voltage amplitudes 34 in the digital target voltage signal 30. However, the voltage mDPD circuit 36 may not be effective in correcting all distortions in the target voltage amplitudes 34, especially when a target voltage amplitude loses correlation with the signal amplitudes 20.

The existing ET amplifier circuit 10 includes a voltage digital-to-analog converter (DAC) 38 configured to convert the digital target voltage signal 30 into a target voltage signal 40 having a time-variant target voltage envelope 42 tracking the target voltage amplitudes 34. The DAC 38 is configured to provide the target voltage signal 40 to the tracker circuit 14.

The tracker circuit 14 is coupled to the DAC 38 to receive the target voltage signal 40 having the time-variant target voltage envelope 42. In this regard, the time-variant target voltage envelope 42 represents a target voltage $V_{TARGET}$ for the tracker circuit 14. The tracker circuit 14 is configured to generate an ET modulated voltage $V_{CC}$ having a time-variant voltage envelope 44 that tracks the time-variant target voltage envelope 42, and thus the target voltage $V_{TARGET}$.

The amplifier circuit 16 is coupled to the signal processing circuit 12 to receive the RF signal 24 having the time-variant power envelope 26. The amplifier circuit 16 is also coupled to the tracker circuit 14 to receive the ET modulated voltage $V_{CC}$ that tracks the time-variant target voltage envelope 42. The amplifier circuit 16 is configured to amplify the RF signal 24 based on the ET modulated voltage $V_{CC}$. In this regard, to maintain linearity and efficiency in the amplifier circuit 16, the time-variant voltage envelope 44 of the ET modulated voltage $V_{CC}$ needs to track the time-variant target voltage envelope 42 closely. However, the time-variant voltage envelope 44 may deviate from the time-variant target voltage envelope 42 due to inherent impedance $Z_{OUT}$ of the tracker circuit 14 and/or the associated load of the amplifier circuit 16. As a result, linearity performance and efficiency of the amplifier circuit 16 may be compromised.

In a non-limiting example, the inherent output impedance $Z_{OUT}$ can be modeled as being primarily determined by an output inductance $L_{ZOUT}$ and/or a resistance $R_{ZOUT}$. Impact of the output inductance $L_{ZOUT}$ on the ET modulated voltage $V_{CC}$ can be expressed in the equation (Eq. 1) below.

$$V_{CC} = V_{TARGET} - L_{ZOUT} \cdot dI_{CC}/dt - R_{ZOUT} I_{CC} \quad (Eq. 1)$$

As shown in equation (Eq. 1) above, the output inductance $L_{ZOUT}$-$R_{ZOUT}$ can further cause a voltage deviation between the target voltage $V_{TARGET}$ and the ET modulated voltage $V_{CC}$. Notably, the voltage deviation can be worsened when the tracker circuit 14 needs to output the ET modulated voltage $V_{CC}$ at a higher modulation bandwidth (e.g., 60 MHz) in response to the RF signal 24 being encoded with a higher number of resource blocks (RBs). As a result, the time-variant voltage envelope 44 may further deviate from the time-variant target voltage envelope 42. Although the voltage mDPD circuit 36 can help reduce deviation between the time-variant voltage envelope 44 and the time-variant target voltage envelope 42, it may be desired to further minimize the ET modulated voltage deviation in the existing ET amplifier circuit 10 to help improve linearity and efficiency of the amplifier circuit 16.

Figure 2:
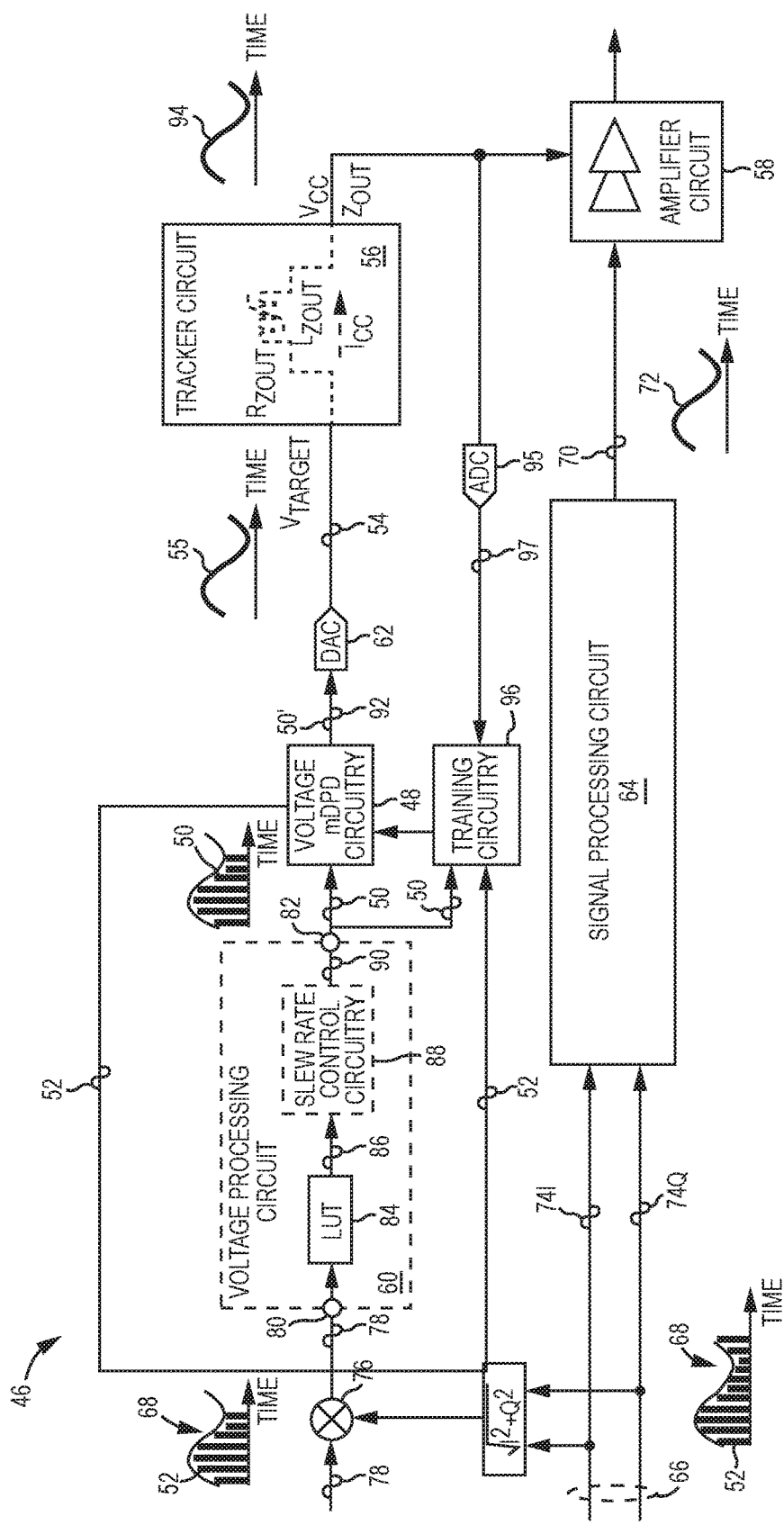
FIG. 2 is a schematic diagram of an exemplary ET amplifier circuit configured to further improve ET modulated voltage deviation over the existing ET amplifier circuit of FIG. 1 according to one embodiment of the present disclosure.

In this regard, FIG. 2 is a schematic diagram of an exemplary ET amplifier circuit 46 configured to further improve ET modulated voltage deviation over the existing ET amplifier circuit 10 of FIG. 1 according to one embodiment of the present disclosure. As discussed below in detail, the ET amplifier circuit 46 differs from the existing ET amplifier circuit 10 of FIG. 1 in that the ET amplifier circuit 46 employs a voltage mDPD circuit 48 to digitally predistort a number of target voltage amplitudes 50 based on a number of signal amplitudes 52 to generate a number of altered target voltage amplitudes 50' that can cause an ET modulated voltage $V_{CC}$ generated by the ET amplifier circuit 46 to closely track (e.g., mirror) the target voltage amplitudes 50. Accordingly, the ET amplifier circuit 46 can generate a target voltage signal 54 having a time-variant target voltage envelope 55 that closely tracks the altered target voltage amplitudes 50'. In a non-limiting example, the target voltage amplitudes 50 are equivalent to the target voltage amplitudes 34 of FIG. 1 and the signal amplitudes 52 are equivalent to the signal amplitudes 20 of FIG. 1. In this regard, the voltage mDPD circuit 48 can effectively overcome ET modulated voltage deviation from the time-variant target voltage envelope 55 resulted from inherent output impedance $Z_{OUT}$ of a tracker circuit 56 and/or associated load of at least one amplifier circuit 58 coupled to the tracker circuit 56. As a result, it is possible to improve overall linearity performance of the ET amplifier circuit 46.

The ET amplifier circuit 46 includes a voltage processing circuit 60 coupled to the voltage mDPD circuit 48 and a voltage DAC 62 provided between the voltage mDPD circuit 48 and the tracker circuit 56. The ET amplifier circuit 46 also includes a signal processing circuit 64. In a non-limiting example, the tracker circuit 56, the voltage DAC 62, the signal processing circuit 64, and the amplifier circuit 58 are functionally equivalent to the tracker circuit 14, the DAC 38, the signal processing circuit 12, and the amplifier circuit 16 of FIG. 1, respectively.

The signal processing circuit 64 receives a digital signal 66 that includes the signal amplitudes 52 representing a time-variant signal envelope 68. The signal processing circuit 64 is configured to convert the digital signal 66 into an RF signal 70 having a time-variant power envelope 72 tracking the time-variant signal envelope 68. In this regard, the time-variant signal envelope 68, which is defined by the signal amplitudes 52, is a digital representation of the time-variant power envelope 72.

The digital signal 66 may be modulated to include a digital in-phase signal 74I, which has a number of in-phase amplitudes I, and a digital quadrature signal 74Q, which has a number of quadrature amplitudes Q. In this regard, the signal amplitudes 52 of the digital signal 66 can be expressed as $\sqrt{I^2 + Q^2}$.

The ET amplifier circuit 46 includes a mixer 76 that combines the signal amplitudes 52 with a digital target voltage signal 78 such that the digital target voltage signal 78 would track the time-variant signal envelope 68. The voltage processing circuit 60 includes an input node 80 coupled to the mixer 76 and an output node 82 coupled to the voltage mDPD circuit 48. As such, the voltage processing circuit 60 receives the signal amplitudes 52 representing the time-variant signal envelope 68 at the input node 80 and generates the target voltage amplitudes 50 based on the signal amplitudes 52, respectively, at the output node 82.

More specifically, the voltage processing circuit 60 includes LUT circuitry 84, which stores predetermined target voltage amplitude values corresponding to each of the signal amplitudes 52. In this regard, the LUT circuitry 84 receives the signal amplitudes 52 and generates a number of predefined voltage amplitudes 86 based on the signal amplitudes 52, respectively. In one embodiment, the LUT circuitry 84 provides the predefined voltage amplitudes 86 directly to the output node 82 such that the predefined voltage amplitudes 86 are provided to the voltage mDPD circuit 48 as the target voltage amplitudes 50.

In another embodiment, the voltage processing circuit 60 can further include slew rate control circuitry 88 coupled between the LUT circuitry 84 and the output node 82. The slew rate control circuitry 88 is configured to receive the predefined voltage amplitudes 86 from the LUT circuitry 84. In a non-limiting example, the slew rate control circuitry 88 nonlinearly modifies the predefined voltage amplitudes 86 to generate a number of modified voltage amplitudes 90 greater than or equal to the predefined voltage amplitudes 86, respectively. For a more detailed description on functions and operational principles of the slew rate control circuitry 88, please refer to U.S. patent application Ser. No. 15/888,300, filed on Feb. 5, 2018. The slew rate control circuitry 88 is further configured to provide the modified voltage amplitudes 90 to the output node 82 such that the modified voltage amplitudes 90 are provided to the voltage mDPD circuit 48 as the target voltage amplitudes 50.

Regardless of whether the voltage processing circuit 60 includes the slew rate control circuitry 88, the voltage mDPD circuit 48 is coupled to the input node 80 and the output node 82 to receive both the signal amplitudes 52 and the target voltage amplitudes 50, respectively. Thus, the voltage mDPD circuit 48 can digitally pre-distort the target voltage amplitudes 50 based on the signal amplitudes 52, respectively, to generate the altered target voltage amplitudes 50'. The voltage mDPD circuit 48 is further configured to generate a digital target voltage signal 92 including the altered target voltage amplitudes 50' that can cause the ET modulated voltage $V_{CC}$ to closely track the target voltage amplitudes 50. The voltage DAC 62 is configured to convert the digital target voltage signal 92 into the target voltage signal 54 having the time-variant target voltage envelope 55 tracking the altered target voltage amplitudes 50'.

The tracker circuit 56 is coupled to the voltage DAC 62 to receive the target voltage signal 54 having the time-variant target voltage envelope 55. In this regard, the time-variant target voltage envelope 55 represents a target voltage $V_{TARGET}$, which tracks closely the altered target voltage amplitudes 50', for the tracker circuit 56. The tracker circuit 56 is configured to generate the ET modulated voltage $V_{CC}$ having a time-variant voltage envelope 94 that tracks the time-variant target voltage envelope 55, and thus the target voltage $V_{TARGET}$. Notably, as a result of the digital pre-distortion performed by the voltage mDPD circuit 48, it is possible to effectively overcome voltage deviation between the time-variant voltage envelope 94 and the time-variant target voltage envelope 55. As a result, it is possible to improve overall linearity performance and efficiency of the amplifier circuit 58.

The ET amplifier circuit 46 includes an analog-to-digital converter (ADC) 95 and training circuitry 96. The ADC 95 is configured to generate a digital voltage feedback signal 97 and provides the digital voltage feedback signal 97 to the training circuitry 96. The training circuitry 96 is also coupled to the output node 82 to receive the target voltage amplitudes 50. The training circuitry 96 may also be coupled to the input node 80 to receive the signal amplitudes 52. In a non-limiting example, the training circuitry 96 is configured to execute an mDPD training algorithm in one or more iterations to extract an mDPD coefficient(s). Accordingly, the voltage mDPD circuit 48 can adjust the altered target voltage amplitudes 50' based on the mDPD coefficient(s) extracted in each of the mDPD iterations such that the ET modulated voltage VCC can closely track the target voltage amplitudes 50.

The amplifier circuit 58 is coupled to the signal processing circuit 64 to receive the RF signal 70 having the time-variant power envelope 72. The amplifier circuit 58 is also coupled to the tracker circuit 56 to receive the ET modulated voltage $V_{CC}$ that tracks the time-variant target voltage envelope 55. The amplifier circuit 58 is configured to amplify the RF signal 70 based on the ET modulated voltage $V_{CC}$.

Figure 3:
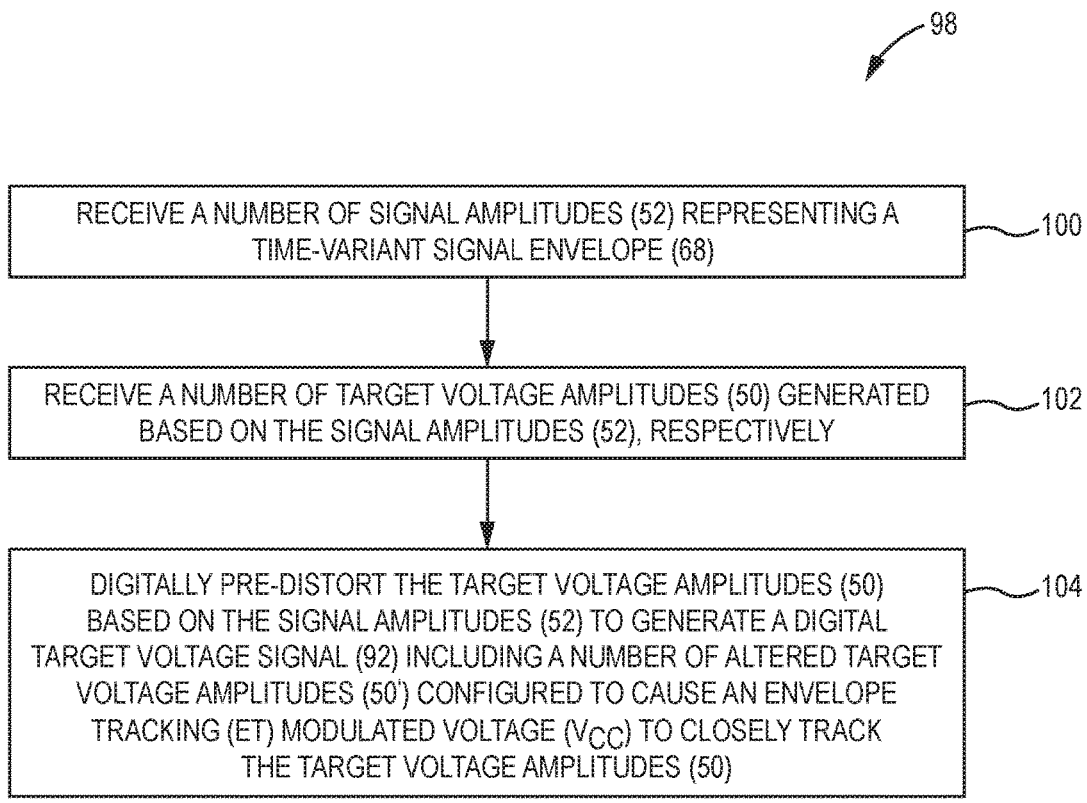
FIG. 3 is a flowchart of an exemplary process that can be employed by the ET amplifier circuit of FIG. 2 to reduce ET modulated voltage deviation.

The ET amplifier circuit 46 and, in particular, the voltage mDPD circuit 48 can be configured to reduce ET modulated voltage deviation according to a process. In this regard, FIG. 3 is a flowchart of an exemplary process 98 that can be employed by the ET amplifier circuit 46 of FIG. 2 to reduce ET modulated voltage deviation.

According to the process 98, the voltage mDPD circuit 48 receives the signal amplitudes 52 representing the time-variant signal envelope 68 (block 100). The voltage mDPD circuit 48 also receives the target voltage amplitudes 50 that are generated based on the signal amplitudes 52, respectively (block 102). The voltage mDPD circuit 48 digitally pre-distorts the target voltage amplitudes 50 based on the signal amplitudes 52 to generate the digital target voltage signal 92 including the altered target voltage amplitudes 50' configured to cause the ET modulated voltage VCC to closely track the target voltage amplitudes 50 (block 104).

Figure 4:
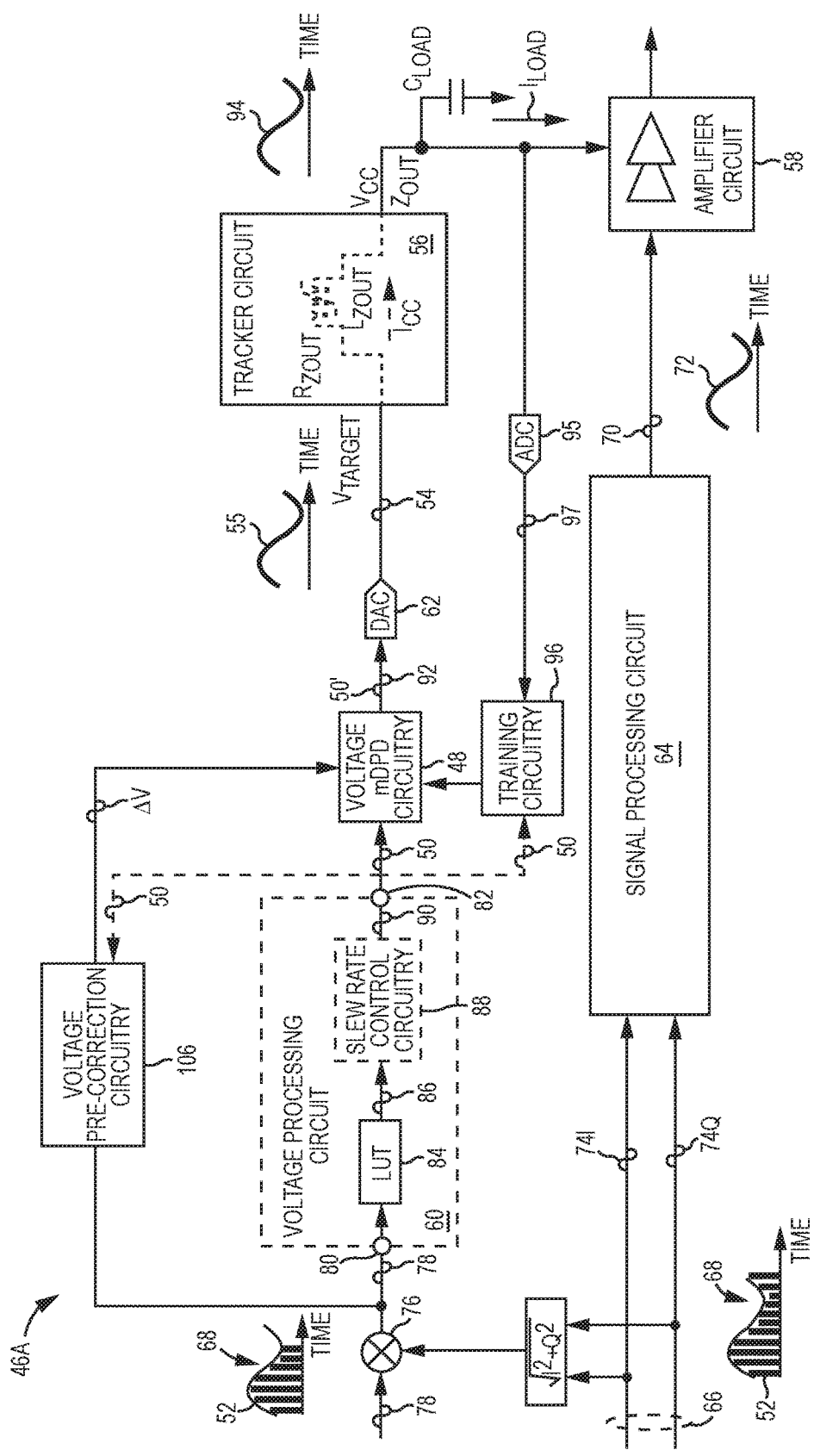
FIG. 4 is a schematic diagram of an exemplary ET amplifier circuit configured to reduce ET modulated voltage deviation according to an alternative embodiment of the present disclosure.

FIG. 4 is a schematic diagram of an exemplary ET amplifier circuit 46A configured to reduce ET modulated voltage deviation according to an alternative embodiment of the present disclosure. Common elements between FIGS. 2 and 4 are shown therein with common element numbers and will not be re-described herein.

The ET amplifier circuit 46A includes voltage pre-correction circuitry 106 that couples the voltage mDPD circuit 48 to the input node 80. The voltage pre-correction circuitry 106 is configured to estimate a load current $I_{LOAD}$ flowing through the amplifier circuit 58 based on the signal amplitudes 52. The voltage pre-correction circuitry 106 then emulates the output impedance $Z_{OUT}$ based on the estimated load current $I_{LOAD}$. Subsequently, the voltage pre-correction circuitry 106 determines a voltage correction term $\Delta V$ based on the emulated output impedance $Z_{OUT}$, as shown in equation (Eq. 2) below, and provides the voltage correction term $\Delta V$ to the voltage mDPD circuit 48.

$$I_{paramp}(t) = I_{LOAD}(t) + I_{CC}(t)$$

$$I_{paramp}(t) = C_{LOAD} * dV_{CC}/dt + I_{CC}(t)$$

$$\Delta V = -(Z_{OUT} ** C_{LOAD} * dV_{CC}/dt + Z_{OUT} ** I_{CC}(t)) \quad \text{(Eq. 2)}$$

Figure 5:
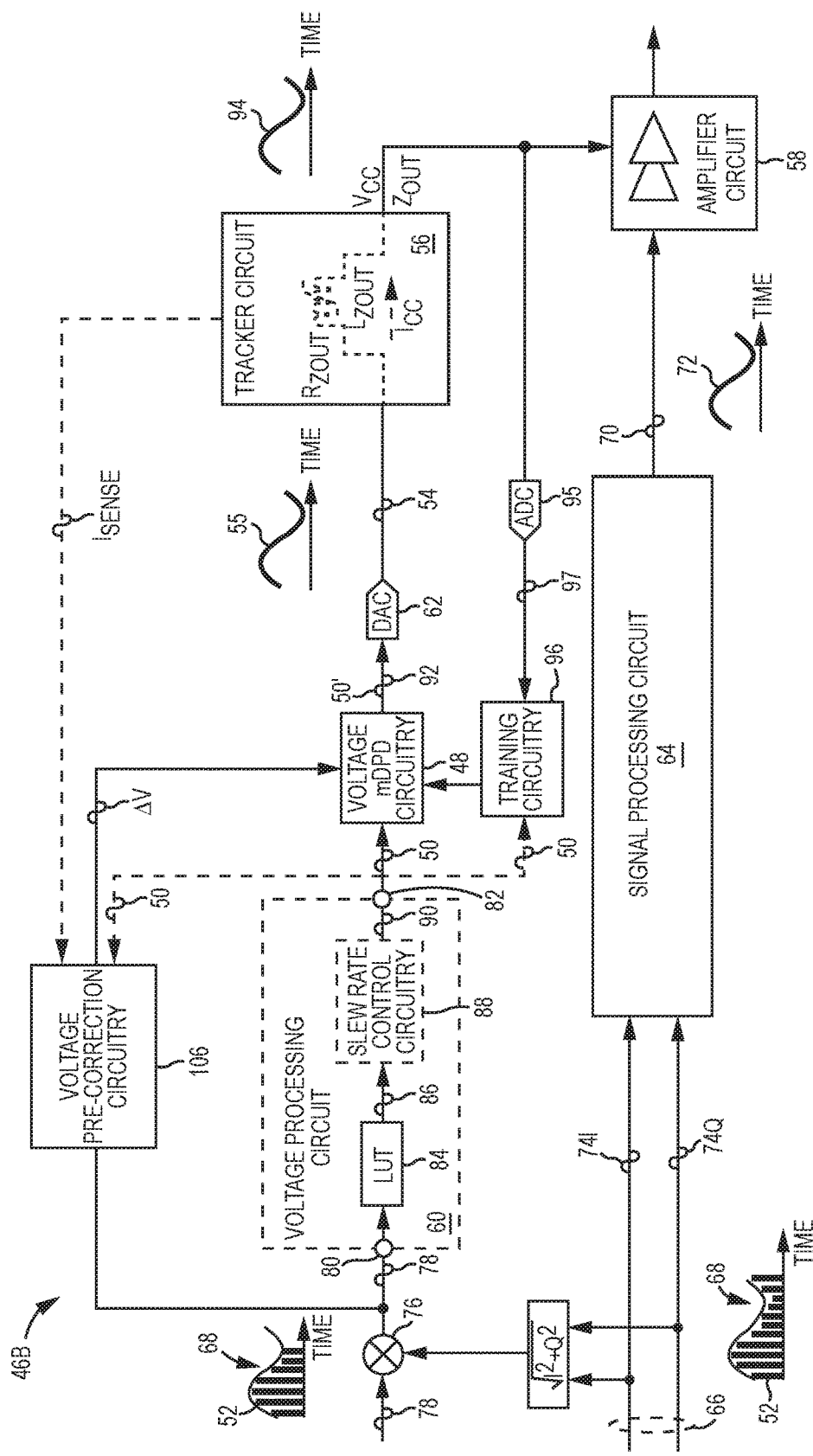
FIG. 5 is a schematic diagram of an exemplary ET amplifier circuit configured to reduce ET modulated voltage deviation according to another alternative embodiment of the present disclosure.

FIG. 5 is a schematic diagram of an exemplary ET amplifier circuit 46B configured to reduce ET modulated voltage deviation according to an alternative embodiment of the present disclosure. Common elements between FIGS. 2, 4, and 5 are shown therein with common element numbers and will not be re-described herein.

In the ET amplifier circuit 46B, the voltage pre-correction circuitry 106 further receives a sense current $I_{SENSE}$ from the tracker circuit 56. In a non-limiting example, the sense current $I_{SENSE}$ is indicative of the current $I_{CC}$ generated by the tracker circuit 56. Accordingly, the voltage pre-correction circuitry 106 can extract a root-mean-square (RMS) current value from the sense current $I_{SENSE}$ and adjust the estimated load current $I_{LOAD}$ based on the extracted RMS current. Subsequently, the voltage pre-correction circuitry 106 can generate the voltage correction term $\Delta V$ in accordance to equation (Eq. 2) and provide the voltage correction term $\Delta V$ to the voltage mDPD circuit 48.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) amplifier circuit comprising:
    a voltage processing circuit comprising an input node and an output node, the voltage processing circuit configured to:
        receive a plurality of signal amplitudes representing a time-variant signal envelope at the input node; and
        generate a plurality of target voltage amplitudes based on the plurality of signal amplitudes, respectively, at the output node; and
    a voltage memory digital pre-distortion (mDPD) circuit coupled to the input node and the output node, the voltage mDPD circuit configured to:
        receive the plurality of signal amplitudes and the plurality of target voltage amplitudes; and
        digitally pre-distort the plurality of target voltage amplitudes based on the plurality of signal amplitudes to generate a digital target voltage signal comprising a plurality of altered target voltage amplitudes configured to cause at least one ET modulated voltage to closely track the plurality of target voltage amplitudes.

2. The ET amplifier circuit of claim 1 wherein the voltage processing circuit further comprises voltage look-up table (LUT) circuitry coupled between the input node and the output node, the voltage LUT circuitry configured to:
    receive the plurality of signal amplitudes via the input node;
    generate a plurality of predefined voltage amplitudes based on the plurality of signal amplitudes, respectively; and
    provide the plurality of predefined voltage amplitudes to the output node such that the plurality of predefined voltage amplitudes is outputted as the plurality of target voltage amplitudes, respectively.

3. The ET amplifier circuit of claim 2 wherein the voltage processing circuit further comprises slew rate control circuitry coupled between the voltage LUT circuitry and the output node, the slew rate control circuitry configured to:
    receive the plurality of predefined voltage amplitudes from the voltage LUT circuitry;
    nonlinearly modify the plurality of predefined voltage amplitudes to generate a plurality of modified voltage amplitudes greater than or equal to the plurality of predefined voltage amplitudes, respectively; and
    provide the plurality of modified voltage amplitudes to the output node such that the plurality of modified voltage amplitudes is outputted as the plurality of target voltage amplitudes, respectively.

4. The ET amplifier circuit of claim 1 further comprising a voltage digital-to-analog converter (DAC) coupled to the voltage mDPD circuit and configured to receive and convert the digital target voltage signal into a target voltage signal having a time-variant target voltage envelope tracking the plurality of altered target voltage amplitudes.

5. The ET amplifier circuit of claim 4 further comprising a tracker circuit coupled to the voltage DAC and configured to generate the at least one ET modulated voltage having a time-variant voltage envelope tracking the time-variant target voltage envelope.

6. The ET amplifier circuit of claim 5 wherein the at least one ET modulated voltage has a voltage modulation bandwidth greater than or equal to 60 MHz.

7. The ET amplifier circuit of claim 5 further comprising a signal processing circuit configured to:
    receive a digital signal having the plurality of signal amplitudes representing the time-variant signal envelope;
    provide the plurality of signal amplitudes to the input node; and
    convert the digital signal into a radio frequency (RF) signal having a time-variant power envelope tracking the time-variant signal envelope.

8. The ET amplifier circuit of claim 7 wherein:
    the digital signal comprises a digital in-phase signal having a plurality of in-phase amplitudes and a digital quadrature signal having a plurality of quadrature amplitudes; and
    the signal processing circuit is further configured to:
        generate the plurality of signal amplitudes based on the plurality of in-phase amplitudes and the plurality of quadrature amplitudes; and
        combine the digital in-phase signal and the digital quadrature signal to generate the RF signal.

9. The ET amplifier circuit of claim 7 wherein the tracker circuit comprises:
    at least one tracker output configured to output the at least one ET modulated voltage;
    at least one voltage tracker configured to receive the target voltage signal and generate the at least one ET modulated voltage at the at least one tracker output; and
    at least one charge pump configured to generate at least one current at the at least one tracker output.

10. The ET amplifier circuit of claim 9 further comprising at least one amplifier circuit coupled to the tracker circuit and the signal processing circuit, the at least one amplifier circuit configured to:
    receive the RF signal from the signal processing circuit;
    receive the at least one ET modulated voltage from the tracker circuit; and
    amplify the RF signal based on the at least one ET modulated voltage.

11. The ET amplifier circuit of claim 10 wherein the voltage mDPD circuit is coupled to the input node via voltage pre-correction circuitry.

12. The ET amplifier circuit of claim 11 wherein the voltage pre-correction circuitry is configured to:
    estimate a load current flowing through the at least one amplifier circuit based on the plurality of signal amplitudes;
    emulate an output impedance based on the estimated load current;
    determine a voltage correction term based on the emulated output impedance; and
    provide the voltage correction term to the voltage mDPD circuit.

13. The ET amplifier circuit of claim 12 wherein the voltage mDPD circuit is further configured to digitally pre-distort the plurality of target voltage amplitudes based on the voltage correction term.

14. The ET amplifier circuit of claim 12 wherein the tracker circuit is further configured to generate a sense current indicative of the at least one current generated by the tracker circuit at the at least one tracker output.

15. The ET amplifier circuit of claim 14 wherein the voltage pre-correction circuitry is further configured to:
 receive the sense current from the tracker circuit;
 extract a root-mean-square (RMS) current value from the sense current; and
 adjust the estimated load current based on the extracted RMS current.

16. An envelope tracking (ET) amplifier apparatus comprising:
 a tracker circuit configured to:
  receive a target voltage signal having a time-variant target voltage envelope; and
  generate an ET modulated voltage having a time-variant voltage envelope that tracks the time-variant target voltage envelope;
 a voltage digital-to-analog converter (DAC) configured to generate the target voltage signal based on a digital target voltage signal;
 a voltage processing circuit comprising an input node and an output node, the voltage processing circuit configured to:
  receive a plurality of signal amplitudes representing a time-variant signal envelope at the input node; and
  generate a plurality of target voltage amplitudes based on the plurality of signal amplitudes, respectively, at the output node; and
 a voltage memory digital pre-distortion (mDPD) circuit coupled to the input node and the output node, the voltage mDPD circuit configured to:
  receive the plurality of signal amplitudes and the plurality of target voltage amplitudes; and
  digitally pre-distort the plurality of target voltage amplitudes based on the plurality of signal amplitudes to generate the digital target voltage signal comprising a plurality of altered target voltage amplitudes configured to cause at least one ET modulated voltage to closely track the plurality of target voltage amplitudes.

17. The ET amplifier apparatus of claim 16 wherein the voltage processing circuit further comprises voltage look-up table (LUT) circuitry coupled between the input node and the output node, the voltage LUT circuitry configured to:
 receive the plurality of signal amplitudes via the input node;
 generate a plurality of predefined voltage amplitudes based on the plurality of signal amplitudes, respectively; and
 provide the plurality of predefined voltage amplitudes to the output node such that the plurality of predefined voltage amplitudes is outputted as the plurality of target voltage amplitudes, respectively.

18. The ET amplifier apparatus of claim 17 wherein the voltage processing circuit further comprises slew rate control circuitry coupled between the voltage LUT circuitry and the output node, the slew rate control circuitry configured to:
 receive the plurality of predefined voltage amplitudes from the voltage LUT circuitry;
 nonlinearly modify the plurality of predefined voltage amplitudes to generate a plurality of modified voltage amplitudes greater than or equal to the plurality of predefined voltage amplitudes, respectively; and
 provide the plurality of modified voltage amplitudes to the output node such that the plurality of modified voltage amplitudes is outputted as the plurality of target voltage amplitudes, respectively.

19. The ET amplifier apparatus of claim 16 further comprising a signal processing circuit configured to:
 receive a digital signal having the plurality of signal amplitudes representing the time-variant signal envelope;
 provide the plurality of signal amplitudes to the input node; and
 convert the digital signal into a radio frequency (RF) signal having a time-variant power envelope tracking the time-variant signal envelope.

20. The ET amplifier apparatus of claim 19 further comprising at least one amplifier circuit coupled to the tracker circuit and the signal processing circuit, the at least one amplifier circuit configured to:
 receive the RF signal from the signal processing circuit;
 receive the at least one ET modulated voltage from the tracker circuit; and
 amplify the RF signal based on the at least one ET modulated voltage.

* * * * *

UNITED STATES PATENT AND TRADEMARK OFFICE
CERTIFICATE OF CORRECTION

PATENT NO. : 10,491,162 B2
APPLICATION NO. : 15/939494
DATED : November 26, 2019
INVENTOR(S) : Jean-Frederic Chiron et al.

Page 1 of 1

It is certified that error appears in the above-identified patent and that said Letters Patent is hereby corrected as shown below:

In the Specification

Column 4, Line 11, replace "(e.g., 60 MHz)" with -- (e.g., $\geq$ 60 MHz) --.

Column 4, Line 43, replace "digital in-phase signal 281" with -- digital in-phase signal 28I --.

Column 5, Lines 59-60, replace "(e.g., 60 MHz)" with -- (e.g., $\geq$ 60 MHz) --.

Column 6, Line 52, replace "digital in-phase signal 741" with -- digital in-phase signal 74I --.

Signed and Sealed this
Eighteenth Day of February, 2020

Andrei Iancu
*Director of the United States Patent and Trademark Office*